US011539560B2

(12) United States Patent
Jany et al.

(10) Patent No.: US 11,539,560 B2
(45) Date of Patent: Dec. 27, 2022

(54) OOK MODULATION DEVICE

(71) Applicant: COMMISSARIAT A L'ENERGIE ATOMIQUE ET AUX ENERGIES ALTERNATIVES, Paris (FR)

(72) Inventors: Clément Jany, Grenoble (FR); Michaël Pelissier, Grenoble (FR)

(73) Assignee: COMMISSARIAT A LENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 17/449,475

(22) Filed: Sep. 30, 2021

(65) Prior Publication Data

US 2022/0109591 A1 Apr. 7, 2022

(30) Foreign Application Priority Data

Oct. 2, 2020 (FR) ....................... 20 10091

(51) Int. Cl.
*H04L 27/12* (2006.01)
*H03B 21/02* (2006.01)
*H03L 7/16* (2006.01)

(52) U.S. Cl.
CPC ............. *H04L 27/12* (2013.01); *H03B 21/02* (2013.01); *H03L 7/16* (2013.01); *H03B 2200/0074* (2013.01)

(58) Field of Classification Search
CPC ......... H04L 27/02; H04L 27/04; H04L 27/08; H04L 27/12; H04L 27/32; H04L 7/16;

(Continued)

(56) References Cited

U.S. PATENT DOCUMENTS 8,629,760 B2 * 1/2014 Liu ................... H03B 5/1231
332/149
8,981,861 B2 * 3/2015 Zhang ................ H03L 7/00
331/173

(Continued)

FOREIGN PATENT DOCUMENTS

EP 2 234 279 A1 9/2010
EP 2 786 492 B1 11/2015

OTHER PUBLICATIONS

U.S. Appl. No. 17/305,725, filed Jul. 14, 2021, Jany, C, et al.

(Continued)

*Primary Examiner* — James M Perez
(74) *Attorney, Agent, or Firm* — Oblon, McClelland, Maier & Neustadt, L.L.P.

(57) ABSTRACT

A device for OOK modulating an input signal, comprising at least:
  an injection-locked oscillator comprising a power supply input, an injection signal input and an output to which the OOK modulated signal is to be delivered;
  a first controlled switch comprising a control input to which the input signal is to be applied, and configured to couple or not a power supply source to the power supply input of the injection-locked oscillator in dependence on the value of the input signal;
  a periodic signal providing device configured to deliver, on an output which is electrically coupled to the injection signal input of the injection-locked oscillator, a periodic injection signal whose frequency and amplitude trigger locking of the injection-locked oscillator at the frequency of the injection signal or a multiple of this frequency.

12 Claims, 3 Drawing Sheets

(58) Field of Classification Search
CPC ...... H03B 2200/006; H03B 2200/0064; H03B 2200/0074; H03B 21/02
See application file for complete search history.

(56) References Cited

U.S. PATENT DOCUMENTS

| | | | | |
|---|---|---|---|---|
| 9,209,748 | B2* | 12/2015 | Siligaris | H04B 1/7174 |
| 9,484,933 | B2* | 11/2016 | Gonzalez Jimenez | H03B 21/02 |
| 9,800,441 | B2* | 10/2017 | Siligaris | H04L 27/04 |
| 9,847,811 | B2* | 12/2017 | Masson | H04B 1/7172 |
| 9,859,991 | B2* | 1/2018 | Jany | H04B 15/04 |
| 10,020,930 | B2* | 7/2018 | Pelissier | H04L 7/0016 |
| 10,341,150 | B2* | 7/2019 | Glattli | H04L 27/20 |
| 10,374,858 | B2* | 8/2019 | Roth | H04L 25/4902 |
| 10,554,458 | B2* | 2/2020 | Ibrahim | H03K 5/00006 |
| 10,862,721 | B2* | 12/2020 | Siligaris | H03D 1/2245 |
| 10,868,701 | B2* | 12/2020 | Pelissier | H03M 7/3068 |
| 10,873,293 | B2* | 12/2020 | Badets | H03B 5/1265 |
| 11,362,752 | B2* | 6/2022 | Dehmas | H04L 1/005 |
| 2004/0133092 | A1* | 7/2004 | Kain | H01F 17/0006 600/377 |
| 2009/0156155 | A1* | 6/2009 | Krug | H04N 21/4382 455/313 |
| 2009/0267738 | A1* | 10/2009 | Liu | H03B 5/1243 332/149 |
| 2013/0328633 | A1* | 12/2013 | Zhang | H03B 5/1218 331/34 |
| 2014/0323062 | A1* | 10/2014 | Siligaris | H04B 1/50 455/76 |
| 2014/0362952 | A1* | 12/2014 | Cheng | H04L 27/12 375/303 |
| 2016/0028495 | A1* | 1/2016 | Jany | H04B 15/04 375/219 |
| 2016/0301552 | A1* | 10/2016 | Siligaris | H03B 5/1278 |
| 2018/0131504 | A1* | 5/2018 | Pelissier | H03M 7/30 |
| 2018/0262379 | A1* | 9/2018 | Roth | H04L 1/005 |
| 2020/0044900 | A1* | 2/2020 | Siligaris | H04L 27/2271 |
| 2020/0186087 | A1* | 6/2020 | Badets | H03K 3/0315 |
| 2020/0220751 | A1* | 7/2020 | Pelissier | H04L 27/12 |
| 2021/0050928 | A1* | 2/2021 | Dehmas | H04L 1/0016 |
| 2021/0067400 | A1* | 3/2021 | Lachartre | H03F 3/24 |
| 2022/0021339 | A1* | 1/2022 | Jany | H04L 27/02 |
| 2022/0057479 | A1* | 2/2022 | Zarudniev | G01S 13/931 |
| 2022/0109591 | A1* | 4/2022 | Jany | H03B 5/1228 |

OTHER PUBLICATIONS

U.S. Appl. No. 17/406,265, filed Aug. 19, 2021, Zarudniev, M, et al.
French Preliminary Search Report dated May 26, 2021 in French Application 20 10091 filed on Oct. 2, 2020, 2 pages (with English Translation of Categories of Cited Documents).
Srivastava et al., "SAW Resonator Oscillator Based Injection Locked OOK Transmitter for MedRadio Spectrum", 2016 14th IEEE International New Circuits and Systems Conference (NEWCAS), IEEE, Jun. 26, 2016, 4 pages.
Haider et al., "A low-voltage low-power injection-locked oscillator for wearable health monitoring systems", Analog Integrated Circuits and Signal Processing, Kluwer Academic Publishers, BO, vol. 66, No. 2, Sep. 3, 2010, pp. 145-154.
Siligaris et al., "From Ultra-Wide-Band signals to coherent frequency synthesis", 2014 IEEE International Conference on Ultra-Wideband (ICUWB), IEEE, Sep. 1, 2014, pp. 175-179.
Tabesh et al., "A Power-Harvesting Pad-Less Millimeter-Sized Radio", IEEE Journal of Solid-State Circuits, vol. 50, No. 4, Apr. 2015, pp. 962-977.

* cited by examiner

OOK MODULATION DEVICE

Technical Field

The invention relates to an OOK (On Off Keying) modulation device applying such modulation to an input signal. This modulation device is advantageously used in an integrated radio frequency transmission network, for example in the field of communication, radar or imaging, to modulate a data signal to be transmitted. This modulation device can also be used within a frequency synthesis device.

State of Prior Art

The so-called millimetre bands (frequencies between approximately 30 to 300 GHz) are used for high rate communications because they offer high bandwidth, and in some cases access to large unlicensed bands (for example the 57-66 GHz band). For short-range communication applications (several millimetres to a few centimetres), power consumption is a very important parameter to consider, especially for nomadic applications (mobiles, tablets, etc.).

OOK modulation is particularly adapted to this context of high-rate, low-consumption communications, especially because it is possible to demodulate a received signal without having to resort to frequency synthesis, and thus be energy-efficient. The transmitter performing such OOK modulation produces a modulated signal consisting of oscillations at the carrier frequency for transmitting bits with a first value (for example "1") and which is zero for transmitting bits with a second value (for example "0"). The following two methods involving an oscillator can be used to produce such an OOK modulated signal:
- leaving the oscillator in continuous operation and interrupting its output upon transmitting a bit of the second value;
- interrupting power supply to the oscillator so that it switches off when a bit of the second value is transmitted, and powering the oscillator again when a bit of the first value is transmitted.

The maximum communication rate that can be achieved using these techniques depends on the speed of opening and closing the switch for the first method, and the speed of switching the oscillator on and off for the second method.

In the scope of the second method, it is possible to unbalance the oscillator at start-up to bring it out of its unstable balance state and thus allow it to start up more quickly.

The paper by M. Tabesh et al, "A Power-Harvesting Pad-Less Millimeter-Sized Radio," in IEEE Journal of Solid-State Circuits, Vol. 50, No. 4, pp. 962-977, April 2015, describes the use of a cross-coupled pair of nMOS transistors in parallel with a resistive LC network to form the oscillator. The oscillator is switched on and off by a transistor situated at the foot of the cross-coupled pair. In this configuration, it is possible to unbalance the cross-coupled pair by injecting a pulse using an additional transistor placed on one branch of the cross-coupled pair of transistors, with the aim of reducing the oscillation set-up time and thus gaining access to higher data rates. This imbalance can also be achieved by using slightly different transistors to form the cross-coupled pair, thus destabilising the balance in which the oscillator is at start-up.

In some cases, by modifying properties of the pulse injected to start up the oscillator, it is possible to modify start-up conditions of the oscillator, and especially its phase at start-up. It is especially possible, as shown in document EP 2 234 279 A1, to make all the oscillation trains start up with a different phase, which results in smoothing the signal spectrum. This solution can also be used to comply with a regulatory transmission spectrum.

DISCLOSURE OF THE INVENTION

There is therefore a need to provide an OOK modulation device with better performance (higher rate and/or lower power consumption) than prior art devices.

For this, one embodiment provides a device for OOK modulating an input signal, comprising at least:
- an injection-locked oscillator (ILO) comprising a power supply input, an injection signal input and an output to which the OOK modulated signal is to be delivered;
- a first controlled switch comprising a control input to which the input signal is to be applied, and configured to couple or not a power supply to the power supply input of the injection-locked oscillator in dependence on the value of the input signal;
- a periodic signal providing device configured to deliver on an output, which is electrically coupled to the injection signal input of the injection-locked oscillator, a periodic injection signal whose frequency and amplitude trigger locking of the injection-locked oscillator to the frequency of the injection signal or a multiple of the frequency of the injection signal.

This device proposes combining modulation made by turning the power supply to an oscillator on and off and locking the oscillator to a periodic signal. The oscillator forms a Super Regeneration Oscillator (SRO), which starts up faster than an oscillator that does not receive an injection signal. This modulation device can therefore perform OOK modulation with a higher data rate without impacting its power consumption.

The injection-locked oscillator includes at least:
- a resonant circuit, for example of the LC type;
- a cross-coupled pair of field effect transistors electrically coupled to the resonant circuit;
- two injection field effect transistors, each electrically coupled to one of the transistors of the cross-coupled pair and whose gates form the injection signal input.

The injection-locked oscillator further includes an unbalancing field effect transistor electrically coupled to one of the transistors of the cross-coupled pair and whose gate is configured to receive a pulse signal for electrically unbalancing the injection-locked oscillator upon starting up the injection-locked oscillator, that is, when the injection-locked oscillator begins oscillating and starts generating a sinusoidal signal.

In one embodiment, the device may further include:
- a second controlled switch comprising a control input to which the input signal is to be applied, and configured to couple or not the power supply source to a power supply input of the periodic signal providing device;
- a delay element comprising an input to which the input signal is to be applied and an output coupled to the control input of the first controlled switch.

This embodiment allows the periodic signal providing device to be electrically powered only when the injection-locked oscillator is to deliver the modulated signal OOK with a non-zero value. The delay element allows the periodic signal providing device to start before the injection-locked oscillator.

A radio frequency signal transmission device is also described, including at least:
- an OOK modulation device;

a radio frequency signal transmitting antenna coupled to the output of the injection-locked oscillator of the OOK modulation device.

A frequency synthesis device is also described, including at least:
- an OOK modulation device;
- an oscillator including an injection signal input electrically coupled to the output of the injection-locked oscillator of the OOK modulation device.

Such a frequency synthesising device allows a frequency stable signal to be output from a lower frequency signal. Such a frequency synthesis device may be intended for use in an RF communication system.

BRIEF DESCRIPTION OF THE DRAWINGS

The present invention will be better understood upon reading the description of exemplary embodiments given by way of illustration only and not in any way limiting purposes with reference to the appended drawings in which.

Figure 1:
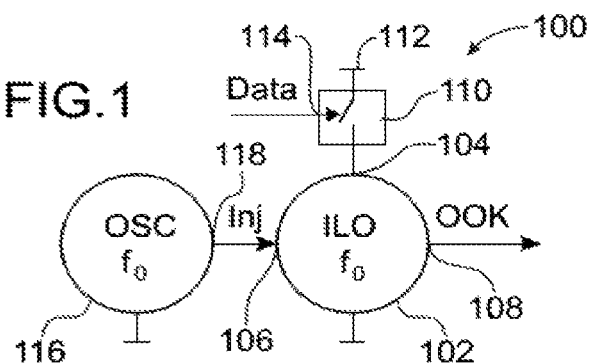
FIG. 1 schematically shows an OOK modulation device according to a first embodiment.

Identical, similar or equivalent parts of the different figures described below bear the same numerical references so as to facilitate switching from one figure to another.

The different parts shown in the figures are not necessarily represented in a uniform scale, to make the figures more legible.

The various possibilities (alternatives and embodiments) should be understood as not being exclusive of each other and may be combined with each other.

DETAILED DISCLOSURE OF PARTICULAR EMBODIMENTS

An OOK modulation device 100 according to a first embodiment is described below in connection with FIG. 1 which schematically shows such a device 100.

The device 100 comprises an injection-locked oscillator, or ILO, 102. The ILO 102 includes a power supply input 104, an injection signal input 106 and an output 108 to which the modulated OOK signal (referred to as "OOK" in FIG. 1) is delivered.

The device 100 also includes a controlled switch 110 interposed between the power supply input 104 of the ILO 102 and a power supply source 112. The controlled switch 110 comprises a control input 114 to which the input signal to be modulated (called "Data" in FIG. 1) is applied. The input signal to be modulated corresponds to a data signal including bits of values "1" or "0" and which is to be modulated by the device 100. The controlled switch 110 is configured to couple or not couple the power supply source 112 to the power supply input 104 of the ILO 102 depending on the value of the bits of the input signal.

The device 100 also includes a periodic signal providing device 116 configured to deliver on an output 118, which is electrically coupled to the injection signal input 106 of the ILO 102, a for example sinusoidal, periodic injection signal (referred to as "Inj" in FIG. 1), the frequency $f_0$ and amplitude of which triggers locking of the ILO 102 to the frequency $f_0$ of the injection signal Inj.

In the exemplary embodiment shown in FIG. 1, the device 116 corresponds to an electrical oscillator. Alternatively, the injection signal Inj may be provided by a device 116 which does not correspond to an oscillator, or even which corresponds to a simple conductive element on which the injection signal Inj flows.

In this device 100, the oscillator forming the device 116 provides the injection signal Inj on its output 118, which corresponds here to a sinusoidal signal of frequency $f_0$. This Injection signal Inj is applied to the injection input 106 of the ILO 102 and is used as an injection signal to cause the ILO 102 to lock to the frequency $f_0$ of the Injection signal Inj. At the same time, the switching on and off of the power supply to the ILO 102 is controlled by the signal Data applied to the control input 114 of the controlled switch 110. According to a first example, a bit "1" of the signal Data may set the controlled switch 110 to the closed position which then supplies power to the ILO 102, and a bit "0" of the signal Data may set the controlled switch 110 to the open position so that the ILO 102 is no longer supplied with power. In a second example involving a different design of the controlled switch 110, a "0" bit of the signal Data may set the controlled switch 110 to the closed position which then provides electrical power to the ILO 102, and a "1" bit of the signal Data may set the controlled switch 110 to the open position so that the ILO 102 is no longer provided with electrical power.

Figure 2:
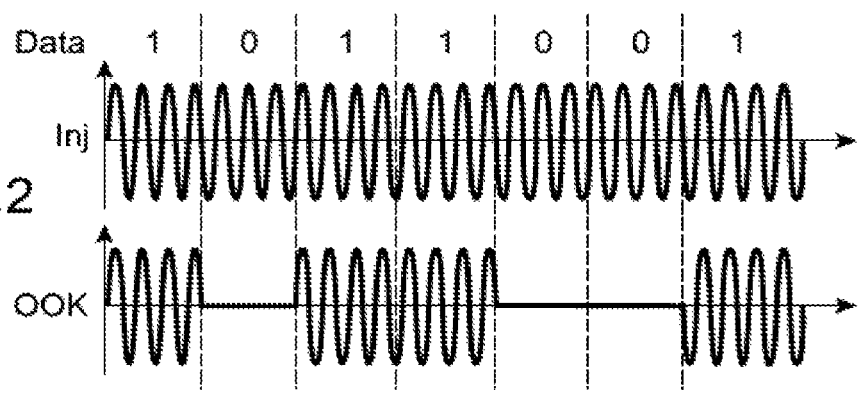
FIG. 2 shows signals obtained in an OOK modulation device according to the first embodiment.

FIG. 2 shows examples of the Data, Inj and OOK signals obtained when a "1" bit of the signal Data sets the controlled switch 110 to the closed position and a "0" bit of the signal Data sets the controlled switch 110 to the open position. In this figure, the injection signal Inj corresponds to a sinusoidal signal.

In order for the ILO 102 to lock to the frequency $f_0$ of the Injection signal Inj, the value of the frequency $f_0$ and the amplitude of the Injection signal Inj are such that the Injection signal Inj is within the locking range, or sensitivity zone, of the ILO 102. This condition is satisfied when the value of the frequency $f_0$ is equal to or close to the free oscillation frequency of the ILO 102 and the injection level, that is the amplitude of the injection signal Inj, is sufficient. The ability of the ILO 102 to lock to the frequency $f_0$ of the injection signal can therefore be achieved by adjusting the values of $f_0$ and the amplitude of the Injection signal Inj, as well as that of the free oscillation frequency of the ILO 102.

The OOK signal obtained on the output 108 of the ILO 102 corresponds to the input signal Data modulated according to an OOK modulation at the frequency $f_0$, that is formed of oscillations with a frequency $f_0$ when the input signal Data closes the controlled switch 110 (when the value of the bit is "1" in the example of FIG. 2) and zero when the input signal Data opens the controlled switch 110 (when the value of the bit is "0" in the example of FIG. 2).

In order to obtain a correct modulation of the input signal, the ratio of the duration of each bit of the input signal Data to the period of the injection signal Inj is strictly greater than 2.

In the device 100, locking of the ILO 102 at the frequency $f_0$ of the Injection signal Inj allows a very fast starting of the ILO 102 to be achieved when the input signal Data closes the controlled switch 110 by virtue of the super-regeneration phenomenon occurring in the ILO 102, the start-up time of the ILO 102 being accelerated by virtue of the energy injected by the Injection signal Inj.

Figure 3:
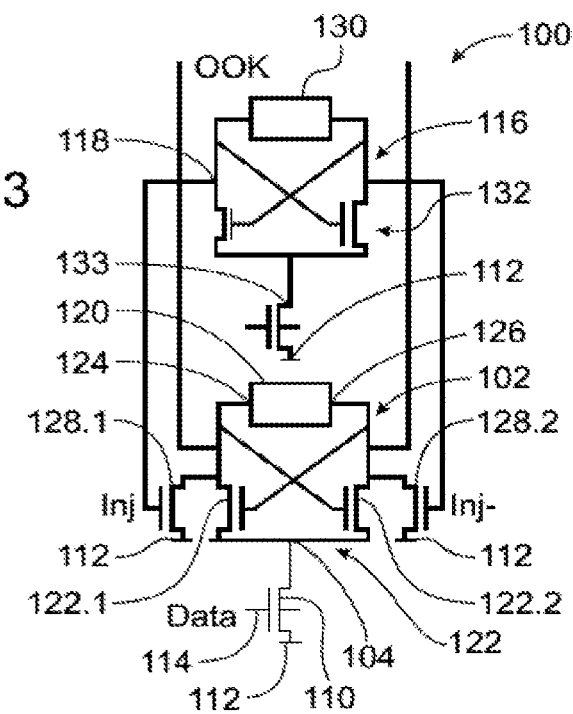
FIG. 3 shows a first exemplary embodiment of an OOK modulation device according to the first embodiment.

A first exemplary embodiment of the device 100 is described below and is shown in FIG. 3.

In this first exemplary embodiment, the ILO 102 includes a resonant circuit 120, for example of the LC type and including at least one inductor and one capacitor coupled to each other in series or in parallel.

The ILO 102 also includes a cross-coupled pair 122 of field effect transistors, here n-type MOSFETs, coupled to the resonant circuit 120. The transistors in this cross-coupled pair 122 are designated 122.1 and 122.2. Transistor 122.1 has its drain coupled to that of transistor 122.2, its source coupled to a first terminal 124 of resonant circuit 120 and its gate coupled to a second terminal 126 of resonant circuit 120. Transistor 122.2 has its source coupled to the second terminal 126 of resonant circuit 120 and its gate coupled to the first terminal 124 of resonant circuit 120. The drains of transistors 122.1, 122.2 form the power supply input 104 of ILO 102.

The ILO 102 also includes two field effect transistors called injection transistors 128.1 and 128.2. In the first exemplary embodiment shown in FIG. 3, the injection transistors 128.1 and 128.2 correspond to n-type MOSFETs. Each of the injection transistors 128.1, 128.2 is electrically coupled to one of the transistors 122.1, 122.2 of the cross-coupled pair 122 and the gates of the injection transistors 128.1, 128.2 form the injection input 106 of the ILO 102. In FIG. 3, transistor 128.1 has its drain coupled to the power supply source 112 of device 100, its source coupled to that of transistor 122.1, and injection signal Inj is applied to its gate. Transistor 128.2 has its drain coupled to the power supply source 112 of device 100, its source coupled to that of transistor 122.2, and a signal Inj, of a value complementary to that of the injection signal Inj, is applied to its gate.

In the example of FIG. 3, the controlled switch 110 is formed by a field effect transistor, here an n-type MOSFET, having its drain coupled to the electrical supply source 112 of the device 100, its source coupled to the electrical supply input 104 of the ILO 102, and its gate forming the control input 114 to which the input signal Data is applied.

In the example of FIG. 3, the periodic signal providing device 116 corresponds to an oscillator formed by a resonant circuit 130, for example similar to the resonant circuit 120 of the ILO 102, and a cross-coupled pair 132 of field effect transistors, coupled to the resonant circuit 130. The resonant circuit 130 is for example of the LC type as in the exemplary embodiment of the resonant circuit 120 previously described. The cross-coupled pair 132 is for example similar to the cross-coupled pair 122 of the ILO 102 and is coupled to the resonant circuit 130 in the same manner as the cross-coupled pair 122 with the resonant circuit 120. The injection signal Inj is obtained at one of the two terminals of the resonant circuit 130 which is coupled to the gate of the transistor 128.1 and forms the output 118 of the device 116, and the signal Inj is obtained at the other of the two terminals of the resonant circuit 130 which is coupled to the gate of the transistor 128.2. The resonant circuit 130 and the cross-coupled pair 132 are electrically powered via a transistor 133 which has its drain coupled to the power supply source 112 of the device 100 and its source coupled to the drains of the transistors of the cross-coupled pair 132. This transistor 133 is in the on state during operation of the device 100.

The OOK signal obtained at the output of device 100 corresponds to the signal obtained at the first terminal 124 of resonant circuit 120. A signal complementary to the OOK signal is obtained at the second terminal 126 of the resonant circuit 120.

According to an exemplary implementation, the input signal Data has a bit rate equal to 20 Gbps (with NRZ or non-return to zero coding), the frequency $f_0$ of the injection signal Inj is equal to 60 GHz.

Figure 4:
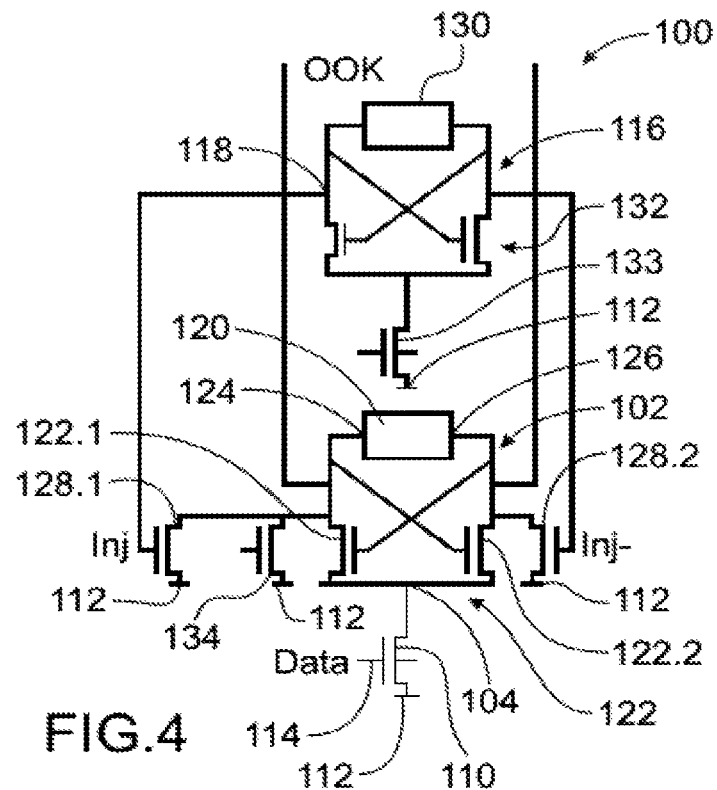
FIG. 4 shows a second exemplary embodiment of an OOK modulation device according to the first embodiment.

A second exemplary embodiment of the device 100 is described below and shown in FIG. 4.

In this second exemplary embodiment, the device 100 includes all the elements of the device 100 according to the first exemplary embodiment previously described in connection with FIG. 3.

Further to these elements, the device 100 according to the second exemplary embodiment includes an additional element for injecting, into the ILO 102, an electrical pulse unbalancing the ILO 102 upon starting it up to bring it out of its unstable balance state and allow it to start up more quickly. In the example of FIG. 4, this additional element corresponds to a field effect transistor 134, for example an n-type MOSFET, coupled to one of the transistors of the cross-coupled pair 122 (transistor 122.1 in the example of FIG. 4) and whose gate receives a pulse signal to electrically unbalance the ILO 102 when the ILO 102 starts up. The transistor 134 is coupled in parallel with the injection transistor 128.1, that is has its drain coupled to the power supply source 112 of the device 100 and its source coupled to that of the injection transistor 128.1.

An OOK modulation device 100 according to a second embodiment is described below in connection with FIG. 5 which schematically shows such a device 100.

As in the first embodiment, the device 100 includes the ILO 102, the controlled switch 110 and the device 116 for providing the injection signal Inj.

The device 100 according to the second embodiment further includes a second controlled switch 136 coupled between a power supply input 138 of the device 116 and the power supply source 112. The second controlled switch 136 comprises a control input 140 to which the input signal Data is applied. When the device 100 is made according to the first or second exemplary embodiment previously described in connection with FIGS. 3 and 4, the second controlled switch 136 corresponds to the transistor 133 and the power supply input 138 is formed by the drains of the transistors of the cross-coupled pair 132.

The device 100 according to the second embodiment also includes a delay element 142 comprising an input 144 to which the input signal Data is applied and an output 146 coupled to the control input 114 of the first controlled switch 110. The delay T applied to the input signal Data is less than the duration of one bit of the input signal Data.

Figure 6:
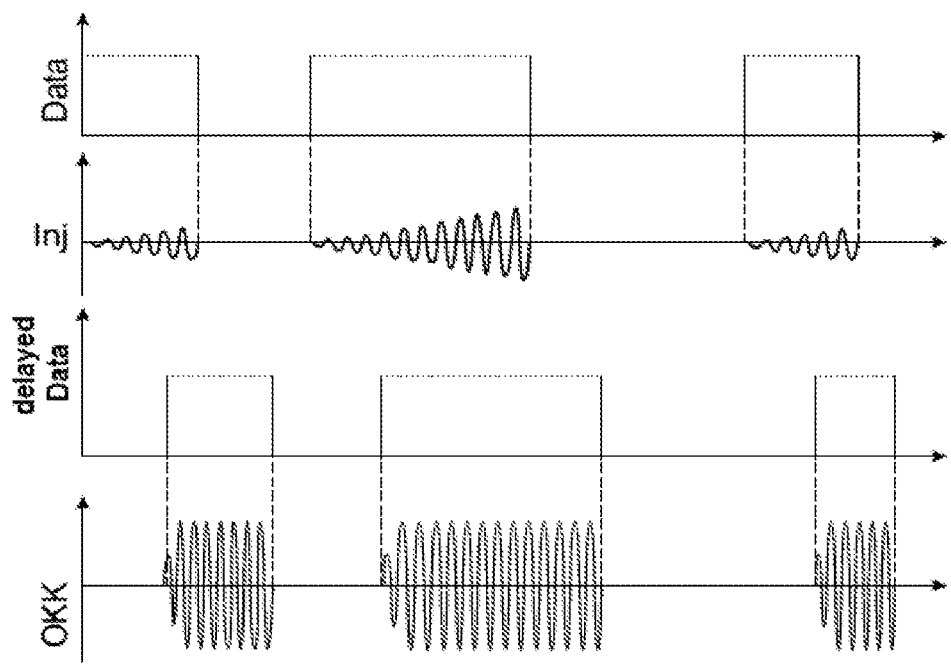
FIG. 6 shows signals obtained in an OOK modulation device according to the second embodiment.

FIG. 6 shows examples of the signals Data, Inj, delayed Data and OOK obtained when a bit "1" of the signals Data and delayed Data sets the controlled switches 110 and 140 to the closed position. In this figure, the slow increase in the amplitude of the Inj signal is very schematically represented to illustrate that even if the amplitude of the oscillations of the signal Inj does not reach the expected value in the steady state, these oscillations will however contribute to the fast start-up of the modulator. In this figure, the Injection signal Inj corresponds to a pulsed signal. More generally, the injection signal Inj may correspond to a "pseudo-sinusoidal" signal, for example formed of portions of sinusoids.

Figure 5:
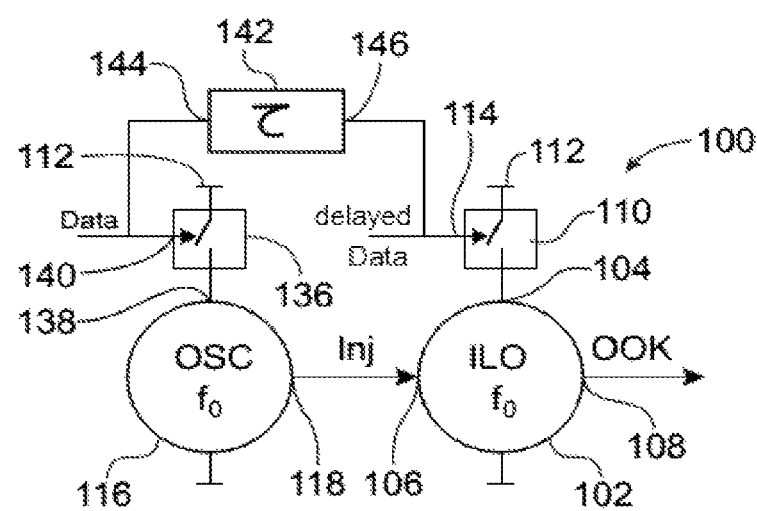
FIG. 5 schematically shows an OOK modulation device according to a second embodiment.

In this second embodiment, the device 116 is not supplied with power continuously as in the first embodiment, but only when the second controlled switch 136 is closed by the input signal Data (when the value of the bits is equal to "1" in the example of FIG. 5). This second embodiment enables the power consumption of the device 100 to be reduced in comparison with the first embodiment.

In the various modes and exemplary embodiments described above, the ILO 102 locks to the frequency $f_0$ of the injection signal Inj which is equal to or close to the free oscillation frequency of the ILO 102. Alternatively, it is possible that the frequency $f_0$ of the injection signal to which the ILO 102 locks corresponds to a multiple of the free oscillation frequency of the ILO 102, that is one of the harmonic frequencies of the free oscillation frequency of the ILO 102, or a sub-multiple of the free oscillation frequency of the ILO 102, that is one of the sub-harmonic frequencies of the free oscillation frequency of the ILO 102. When the lock frequency $f_0$ of the ILO 102 corresponds to a sub-multiple of the free oscillation frequency of the ILO 102, the power consumption of the device 100 is reduced in comparison with cases where the lock frequency $f_0$ of the ILO 102 corresponds to the free oscillation frequency of the ILO 102 or a multiple of the free oscillation frequency of the ILO 102.

Several examples of applications of the OOK modulation device 100 are described below.

Figure 7:
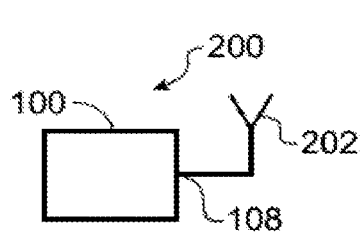
FIGS. 7 and 8 show radio frequency signal transmitting devices according to different embodiments.
Figure 8:
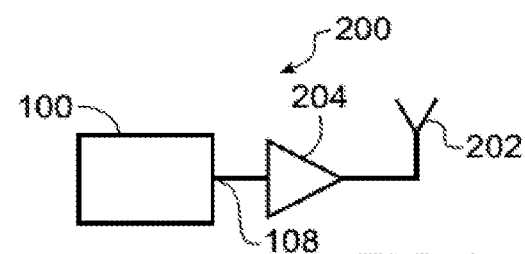

FIGS. 7 and 8 show radio frequency signal transmitting devices 200 according to two embodiments. Each of the devices 200 includes an OOK modulation device 100 as previously described. In FIG. 7, the output 108 of the ILO 102 of the device 100 is coupled to an antenna 202 performing transmission of the OOK modulated signal delivered on the output 108. In FIG. 8, the output 108 of the ILO 102 of the device 100 is coupled to the input of an amplifier 204 and the output of the amplifier 204 is coupled to the antenna 202.

Figure 9:
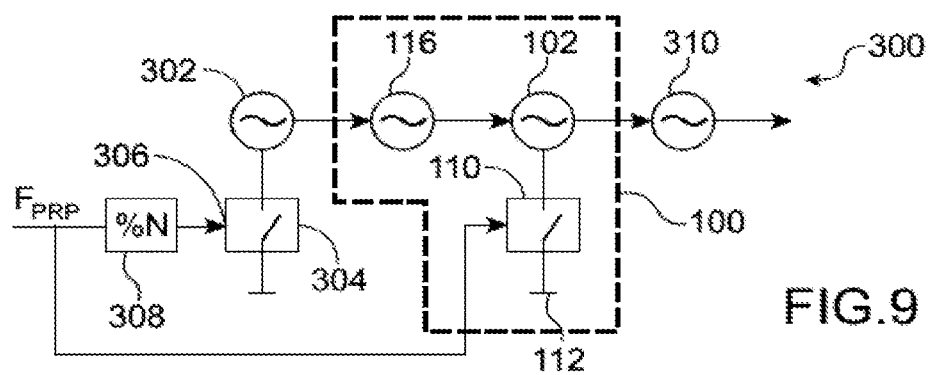
FIG. 9 shows a frequency synthesis device according to a particular embodiment.

FIG. 9 shows a frequency synthesis device 300 according to a particular embodiment.

The device 300 includes a first oscillator 302 electrically powered through a controlled switch 304 receiving on a control input 306 a periodic control signal with a frequency $f_{PRP}/N$, with N an integer greater than 1. This control signal is obtained at the output of a frequency divider 308 to which a periodic signal of frequency $f_{PRP}$ is input and applying a division factor equal to N to the frequency signal $f_{PRP}$. This frequency divider is used because the first oscillator 302 does not receive an injection signal and the frequency $f_{PRP}$ is too large to be used with such an oscillator. In this configuration, the first oscillator 302 generates an output signal called PROT ("Periodically Repeated Oscillations Train") corresponding to a train of oscillations with a frequency substantially equal to $f_0$ (with $f_0 > f_{PRP}/N$), with a duration less than $T=N/f_{PRP}$ and periodically repeated at the frequency $f_{PRP}/N$. Details on the operation of a PROT signal generating device are found in EP 2 786 492 B1.

The device 300 also includes a modulation device 100 according to one of the previously described embodiments. The PROT signal delivered by the first oscillator 302 is input to the device 116 of the device 100, which device 116 corresponds to an oscillator in the example shown in FIG. 9. The oscillator 116 outputs a periodic injection signal, which is for example sinusoidal with a frequency $f_0$. The signal of frequency $f_{PRP}$ is applied to the control input of the controlled switch 110. The signal output to the device 100 corresponds to the OOK modulated frequency signal $f_{PRP}$ at the frequency $f_0$. This signal output from the device 100 corresponds to a coherent PROT signal, that is whose phase at start-up of each train of oscillations is always the same.

The device 300 also includes a second oscillator 310 receiving the signal delivered by the device 100 as an input and outputting a sinusoidal signal of frequency $f_0$.

The device 300 thus made enables a sinusoidal signal with a frequency equal to $f_0$ to be synthesised.

This device 300 provides more flexibility in generating the frequency plan because the locking range of the device 116 is dimensioned so that the harmonics of the FPRP/n frequency fall within the locking band of the device 116.

Regardless of the exemplary embodiment of the device 100, the periodic injection signal may or may not be sinusoidal.

Furthermore, the resonant circuits 120 and 130 may correspond to LC-type or different type resonant circuits. For example, at least one of the resonant circuits 120, 130 may correspond to an astable resonant circuit, for example formed by a system to which feedback is applied and which is within the stability limit.

REFERENCES CITED

1: M. Tabesh et al., "A Power-Harvesting Pad-Less Millimeter-Sized Radio," in IEEE Journal of Solid-State Circuits, vol. 50, no 4, pp. 962-977, Avril 2015.
2: EP 2 234 279 A1
3: EP 2 786 492 B1.

The invention claimed is:

1. A device for OOK modulating an input signal, comprising at least:
    an injection-locked oscillator comprising a power supply input, an injection signal input and an output to which the modulated OOK signal is to be delivered;
    a first controlled switch comprising a control input to which the input signal is to be applied, and configured to couple or not a power supply source to the power supply input of the injection-locked oscillator in dependence on the value of the input signal;
    a periodic signal providing device configured to deliver, on an output which is electrically coupled to the injection signal input of the injection-locked oscillator, a periodic injection signal whose frequency and amplitude trigger locking of the injection-locked oscillator to the frequency of the injection signal or a multiple of the frequency of the injection signal;
    wherein the injection-locked oscillator includes at least:
    a resonant circuit;
    a cross-coupled pair of field effect transistors electrically coupled to the resonant circuit; and
    two injection field effect transistors, each electrically coupled to one of the transistors of the cross-coupled pair and whose gates form the injection signal input; and
    an unbalancing field effect transistor electrically coupled to one of the transistors of the cross-coupled pair and whose gate is configured to receive a pulse signal for electrically unbalancing the injection-locked oscillator upon starting up the injection-locked oscillator.

2. The device according to claim 1, wherein the resonant circuit is of the LC type.

3. The device according to claim 1, wherein the first controlled switch includes a field effect transistor whose gate is electrically coupled to the control input of the first controlled switch and whose source and drain are electrically coupled to the power supply source and the power supply input of the injection-locked oscillator.

4. The device according to claim 1, wherein the periodic signal providing device includes an electrical oscillator.

5. The device according to claim 4, wherein the electrical oscillator of the periodic signal providing device includes at least:
   a resonant circuit;
   a cross-coupled pair of field effect transistors electrically coupled to the resonant circuit of the electrical oscillator.

6. The device according to claim 5, wherein the resonant circuit is of the LC type.

7. The device according to claim 1, further including:
   a second controlled switch comprising a control input to which the input signal is to be applied, and configured to couple or not the power supply source to a power supply input of the periodic signal providing device;
   a delay element comprising an input to which the input signal is to be applied and an output coupled to the control input of the first controlled switch.

8. The device according to claim 1, wherein the periodic injection signal corresponds to a sinusoidal signal.

9. A device for transmitting radio frequency signals, including at least:
   an OOK modulation device according to claim 1;
   a radio frequency signal transmission antenna coupled to the output of the injection-locked oscillator of the OOK modulation device.

10. The device according to claim 9, further including at least one amplifier comprising an input electrically coupled to the output of the injection-locked oscillator of the OOK modulation device and an output electrically coupled to the antenna.

11. A frequency synthesis device, including at least:
   an OOK modulation device according to claim 1;
   an oscillator including an injection signal input electrically coupled to the output of the injection-locked oscillator of the OOK modulation device.

12. The device according to claim 11, wherein the periodic signal providing device of the OOK modulation device includes an injection-locked oscillator, and further including a circuit for generating a PROT signal corresponding to trains of periodically repeated oscillations at a frequency $F_{PRP}$ whose oscillations are of frequency $F0 > F_{PRP}$ and each train of oscillations of which has a duration less than $1/F_{PRP}$, and wherein an output of the PROT signal generating circuit is electrically coupled to an injection signal input of the injection-locked oscillator of the periodic signal providing device of the OOK modulation device.

* * * * *

UNITED STATES PATENT AND TRADEMARK OFFICE
CERTIFICATE OF CORRECTION

| | |
|---|---|
| PATENT NO. | : 11,539,560 B2 |
| APPLICATION NO. | : 17/449475 |
| DATED | : December 27, 2022 |
| INVENTOR(S) | : Clement Jany et al. |

It is certified that error appears in the above-identified patent and that said Letters Patent is hereby corrected as shown below:

On the Title Page

Item (73), the Assignee's name is incorrect. Item (73) should read:
-- (73) Assignee: COMMISSARIAT A L'ENERGIE ATOMIQUE ET AUX ENERGIES ALTERNATIVES, Paris (FR) --

Signed and Sealed this
Sixteenth Day of May, 2023

Katherine Kelly Vidal
*Director of the United States Patent and Trademark Office*